(12) United States Patent
Park et al.

(10) Patent No.: US 12,336,106 B2
(45) Date of Patent: Jun. 17, 2025

(54) PANEL ALIGNMENT DEVICE FOR A DISPLAY DEVICE

(71) Applicant: Samsung Display Co., Ltd., Yongin-si (KR)

(72) Inventors: Jungseon Park, Cheonan-si (KR); Wunbong Tak, Asan-si (KR); Jaeseong Lee, Jeongeup-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 15 days.

(21) Appl. No.: 18/524,845

(22) Filed: Nov. 30, 2023

(65) Prior Publication Data

US 2024/0098955 A1 Mar. 21, 2024

Related U.S. Application Data

(62) Division of application No. 17/356,977, filed on Jun. 24, 2021, now Pat. No. 11,877,400.

(30) Foreign Application Priority Data

Nov. 5, 2020 (KR) .................. 10-2020-0147007

(51) Int. Cl.
*B23P 19/00* (2006.01)
*H05K 1/18* (2006.01)
(Continued)

(52) U.S. Cl.
CPC ......... *H05K 13/0015* (2013.01); *H05K 1/181* (2013.01); *H05K 13/0812* (2018.08);
(Continued)

(58) Field of Classification Search
CPC .... H05K 3/0008; H05K 3/303; H05K 1/0269; H05K 1/181; H05K 13/0015;
(Continued)

(56) References Cited

U.S. PATENT DOCUMENTS 5,160,848 A 11/1992 Saitoh et al.
7,728,945 B2 6/2010 Liu et al.
(Continued)

FOREIGN PATENT DOCUMENTS

JP 19970945728 A 2/1997
JP 2007019147 A 1/2007
(Continued)

*Primary Examiner* — Paul D Kim
(74) *Attorney, Agent, or Firm* — CANTOR COLBURN LLP

(57) ABSTRACT

A panel alignment device for a display device includes a stage supporting a panel and including a transmitting portion that includes a first region having a first thickness and a second region having a second thickness greater than the first thickness, a head disposed over the stage and supporting a driving chip, a vision camera which is disposed under the stage, captures a first alignment mark of the panel through the first region, and captures a second alignment mark of the driving chip through the second region, and a controller which controls at least one of a movement and a rotation of each of the stage and the head based on first image information related to a position of the first alignment mark and second image information related to a position of the second alignment mark.

5 Claims, 9 Drawing Sheets

(51) Int. Cl.
*H05K 13/00* (2006.01)
*H05K 13/04* (2006.01)
*H05K 13/08* (2006.01)

(52) U.S. Cl.
CPC .............. *H05K 13/0813* (2018.08); *H05K 2201/10128* (2013.01); *H05K 2201/10212* (2013.01)

(58) Field of Classification Search
CPC ..... H05K 13/0813; H05K 2201/10128; H05K 2201/10212
See application file for complete search history.

(56) References Cited

U.S. PATENT DOCUMENTS

| | | | |
|---|---|---|---|
| 11,495,378 B2 * | 11/2022 | Inoue | H01F 41/0233 |
| 12,199,055 B2 * | 1/2025 | Lee | H01L 24/05 |
| 2009/0224777 A1 * | 9/2009 | Kim | G02F 1/1309 |
| | | | 702/58 |
| 2010/0026993 A1 * | 2/2010 | Kim | G01M 11/0221 |
| | | | 356/124 |
| 2017/0278452 A1 | 9/2017 | Oh et al. | |

FOREIGN PATENT DOCUMENTS

| KR | 1020080100583 A | 11/2008 |
|---|---|---|
| KR | 1020120060369 A | 6/2012 |
| KR | 102025192 B1 | 9/2019 |

* cited by examiner

510

610

PANEL ALIGNMENT DEVICE FOR A DISPLAY DEVICE

This application is a divisional of U.S. patent Ser. No. 17/356,977, filed on Jun. 24, 2021, now U.S. Pat. No. 11,877,400, which claims priority to Korean Patent Application No. 10-2020-0147007 filed on Nov. 5, 2020, and all the benefits accruing therefrom under 35 U.S.C. § 119, the content of which in its entirety is herein incorporated by reference.

BACKGROUND

1. Field

Embodiments relate to a panel alignment device. More particularly, embodiments relate to a panel alignment device and a panel alignment method for aligning a panel and a driving chip of a display device.

2. Description of the Related Art

A display device is a device that displays an image. Recently, various types of flat panel display devices are widely used. The flat panel display devices include a liquid crystal display ("LCD") device, an organic light emitting display ("OLED") device, or the like, for example.

The display device may include a panel and a driving chip connected to the panel. In order to connect the panel and the driving chip, an alignment device for aligning the panel and the driving chip, a bonding device for bonding the panel and the driving chip, or the like may be used.

SUMMARY

In a process for aligning the panel and the driving chip, after recognizing an alignment mark of the panel and an alignment mark of the driving chip using a vision camera, the panel and the driving chip may be aligned. However, since a distance between the vision camera and the panel and a distance between the vision camera and the driving chip are different from each other, a recognition rate of the alignment marks may be lowered.

Embodiments provide a panel alignment device and a panel alignment method for improving alignment between a panel and a driving chip of a display device.

A panel alignment device for a display device in an embodiment includes a stage supporting a panel and including a transmitting portion that includes a first region having a first thickness and a second region having a second thickness greater than the first thickness, a head disposed over the stage and supporting a driving chip, a vision camera which is disposed under the stage, captures a first alignment mark of the panel through the first region, and captures a second alignment mark of the driving chip through the second region, and a controller which controls at least one of a movement and a rotation of each of the stage and the head based on first image information related to a position of the first alignment mark and second image information related to a position of the second alignment mark.

In an embodiment, the transmitting portion may include quartz.

In an embodiment, the first alignment mark may overlap the first region.

In an embodiment, the second alignment mark may overlap the second region when capturing the second alignment mark.

In an embodiment, a first distance from the vision camera to the first alignment mark may be less than a second distance from the vision camera to the second alignment mark.

In an embodiment, the head may be movable and rotatable.

In an embodiment, the stage may be movable.

In an embodiment, the stage may further include a non-transmitting portion surrounding the transmitting portion and supporting the panel. The second thickness may be substantially equal to a thickness of the non-transmitting portion.

In an embodiment, the non-transmitting portion may include anodized aluminum.

In an embodiment, the controller may move and rotate the stage and the head such that the first alignment mark overlaps the second alignment mark.

In an embodiment, the controller may move the head such that the driving chip is bonded to the panel.

A panel alignment device for a display device in an embodiment includes a stage which supports a panel and includes a transmitting portion which is adjacent to an opening defined in the stage, a head disposed over the stage and supporting a driving chip, a vision camera which is disposed under the stage, captures a first alignment mark of the panel through the opening, and captures a second alignment mark of the driving chip through the transmitting portion, and a controller which controls at least one of a movement and a rotation of each of the stage and the head based on first image information related to a position of the first alignment mark and second image information related to a position of the second alignment mark.

In an embodiment, the first alignment mark may overlap the opening.

In an embodiment, the second alignment mark may overlap the transmitting portion when capturing the second alignment mark.

In an embodiment, a thickness of the transmitting portion may be uniform.

In an embodiment, the stage may further include a non-transmitting portion surrounding the opening and the transmitting portion, and supporting the panel. A thickness of the transmitting portion may be substantially equal to a thickness of the non-transmitting portion.

A panel alignment method for a display device in an embodiment may include collecting first image information by capturing a first alignment mark of a panel through a first region of a transmitting portion of a stage, the first region having a first thickness, moving a stage, collecting second image information by capturing a second alignment mark of a driving chip through a second region of the transmitting portion of the stage, the second region having a second thickness greater than the first thickness, and adjusting a position of a head supporting the driving chip and a position of the stage supporting the panel based on the first image information and the second image information.

In an embodiment, adjusting the position of the head and the position of the stage may include moving and rotating the head.

In an embodiment, adjusting the position of the head and the position of the stage may further include moving the stage.

In an embodiment, the panel alignment method may further include bonding the driving chip to the panel by moving the head.

In the panel alignment device for the display device in the embodiments, the transmitting portion of the stage may include the first region having the first thickness and overlapping the first alignment mark of the panel and the second region having the second thickness greater than the first thickness and overlapping the second alignment mark of the driving chip, so that the vision camera disposed under the stage may accurately recognize the first alignment mark and the second alignment mark.

In the panel alignment method for the display device in the embodiments, the first alignment mark may be captured through the first region of the transmitting portion of the stage having the first thickness, and the second alignment mark may be captured through the second region of the transmitting portion of the stage having the second thickness greater than the first thickness, so that the alignment time between the panel and the driving chip may decrease.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
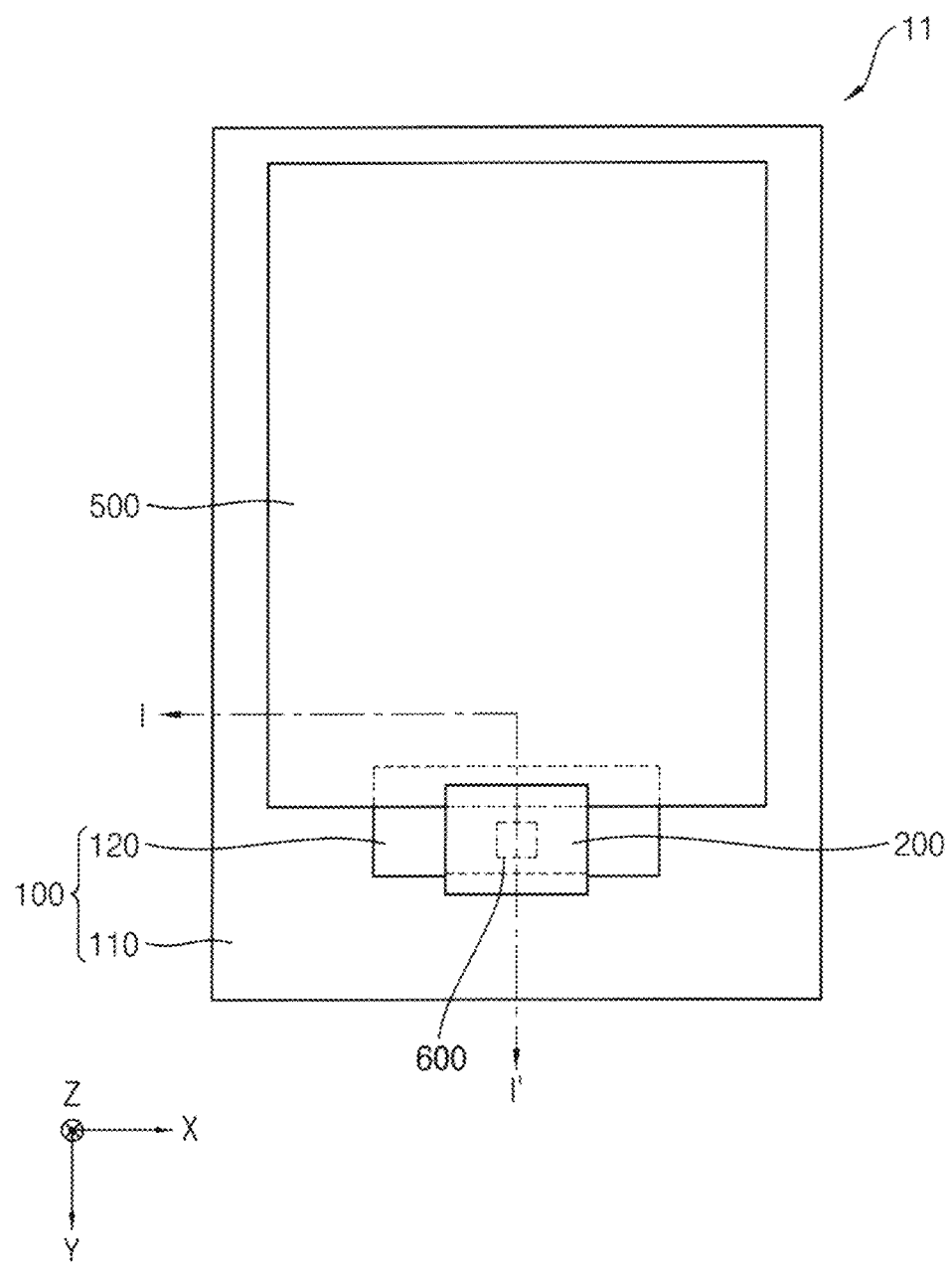
FIG. 1 is a plan view illustrating an embodiment of a panel alignment device.

Hereinafter, panel alignment devices and panel alignment methods for display devices in embodiments will be explained in detail with reference to the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 2:
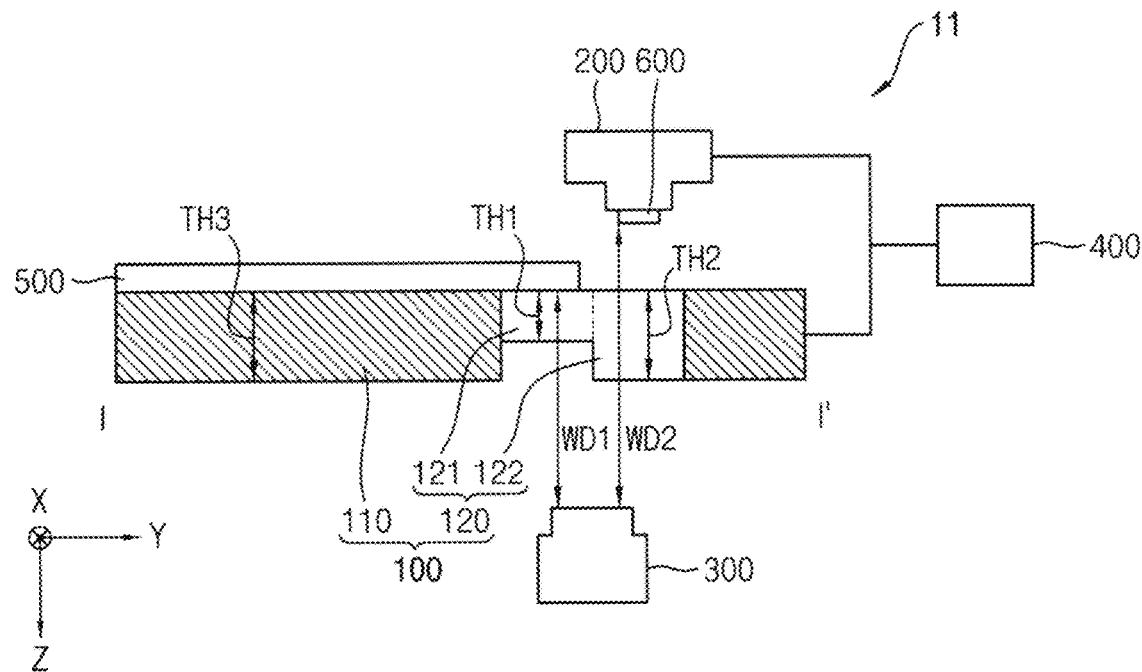
FIG. 2 is a diagram illustrating the panel alignment device taken along line I-I' in FIG. 1.

FIG. 1 is a plan view illustrating an embodiment of a panel alignment device. FIG. 2 is a diagram illustrating the panel alignment device taken along line I-I' in FIG. 1.

Referring to FIGS. 1 and 2, a panel alignment device 11 may include a stage 100, a head 200, a vision camera 300, and a controller 400.

The stage 100 may support a panel 500. The panel 500 may be disposed on an upper surface of the stage 100. A first alignment mark for alignment of the panel 500 and a driving chip 600 may be provided on the panel 500.

The stage 100 may include a non-transmitting portion 110 and a transmitting portion 120. The transmitting portion 120 may have a quadrangular (e.g., rectangular) planar shape, and the non-transmitting portion 110 may surround the transmitting portion 120 in a plan view.

The non-transmitting portion 110 may support the panel 500. The non-transmitting portion 110 may block or absorb light. In other words, the non-transmitting portion 110 may not transmit light.

In an embodiment, the non-transmitting portion 110 may include anodized aluminum. However, the material of the non-transmitting portion 110 is not limited thereto, and the non-transmitting portion 110 may include a material capable of blocking or absorbing light.

The transmitting portion 120 may transmit light. In an embodiment, the transmitting portion 120 may include quartz. However, the material of the transmitting portion 120 is not limited thereto, and the transmitting portion 120 may include a material capable of transmitting light.

The transmitting portion 120 may include a first region 121 having a first thickness TH1 and a second region 122 having a second thickness TH2 greater than the first thickness. The panel 500 may overlap the first region 121 of the transmitting portion 120 and a part of the non-transmitting portion 110 adjacent to the first region 121. The panel 500 may not overlap the second region 122 of the transmitting portion 120.

In an embodiment, the second thickness TH2 of the second region 122 may be substantially equal to a thickness TH3 of the non-transmitting portion 110. In such an embodiment, the first thickness TH1 of the first region 121 may be less than the thickness TH3 of the non-transmitting portion 110.

In an embodiment, the stage 100 may be movable. In an embodiment, the stage 100 may move along an X-axis direction and a Y-axis direction, for example. Accordingly, the panel 500 may move according to the movement of the stage 100.

The head 200 may be disposed over the stage 100. The head 200 may support the driving chip 600. The driving chip 600 may be disposed on a lower surface of the head 200. A second alignment mark for alignment of the panel 500 and the driving chip 600 may be provided on the driving chip 600.

In an embodiment, the head 200 may be movable and rotatable. In an embodiment, the head 200 may move along the X-axis direction, the Y-axis direction, and a Z-axis direction, and may rotate with the Z-axis direction as a rotation axis, for example. Accordingly, the driving chip 600 may move and/or rotate according to the movement and/or the rotation of the head 200.

The vision camera 300 may be disposed under the stage 100. The vision camera 300 may capture the first alignment mark of the panel 500 through the first region 121 of the transmitting portion 120 of the stage 100, and may capture the second alignment mark of the driving chip 600 through the second region 122 of the transmitting portion 120 of the stage 100.

In an embodiment, the first alignment mark of the panel 500 may overlap the first region 121 of the transmitting portion 120 of the stage 100. Accordingly, the vision camera 300 may capture the first alignment mark of the panel 500 through the first region 121 of the transmitting portion 120 of the stage 100.

In an embodiment, the second alignment mark may overlap the second region 122 of the transmitting portion 120 of the stage 100 when capturing the second alignment mark of the driving chip 600. Accordingly, the vision camera 300 may capture the second alignment mark of the driving chip 600 through the second region 122 of the transmitting portion 120 of the stage 100.

In an embodiment, a first distance WD1 from the vision camera 300 to the first alignment mark of the panel 500 may be less than a second distance WD2 from the vision camera 300 to the second alignment mark of the driving chip 600. In other words, the second alignment mark of the driving chip 600 may be disposed farther from the vision camera 300 than the first alignment mark of the panel 500 is from the vision camera 300. Since the stage 100 supporting the panel 500 is disposed over the vision camera 300 and the head 200 supporting the driving chip 600 is disposed over the stage 100, the first distance WD1 may be less than the second distance WD2.

The controller 400 may control the movement and/or the rotation of the stage 100 and/or the head 200 based on first image information related to a position of the first alignment mark of the panel 500 and second image information related to a position of the second alignment mark of the driving chip 600. The first image information may be collected from a first image in which the first alignment mark of the panel 500 is captured, and the second image information may be collected from a second image in which the second alignment mark of the driving chip 600 is captured.

In an embodiment, the controller 400 may move and/or rotate the stage 100 and/or the head 200 such that the first alignment mark of the panel 500 overlaps the second alignment mark of the driving chip 600. Accordingly, the stage 100 and/or the head 200 may be moved and/or rotated so that the panel 500 and the driving chip 600 may be aligned.

In an embodiment, the controller 400 may move and rotate the head 200 such that the first alignment mark of the panel 500 may overlap the second alignment mark of the driving chip 600. In an embodiment, the controller 400 may move the head 200 along the X-axis direction and the Y-axis direction, and may rotate the head 200 with the Z-axis direction as a rotation axis, for example.

In another embodiment, the controller 400 may move the stage 100 and may move and rotate the head 200 such that the first alignment mark of the panel 500 overlaps the second alignment mark of the driving chip 600. In an embodiment, the controller 400 may move the stage 100 along the Y-axis direction, may move the head 200 along the X-axis direction, and may rotate the head 200 with the Z-axis direction as a rotation axis, for example.

In an embodiment, the controller 400 may move the head 200 such that the driving chip 600 is bonded to the panel 500 in a state in which the first alignment mark of the panel 500 overlaps the second alignment mark of the driving chip 600. In an embodiment, the controller 400 may move the head 200 along the Z-axis direction so that the driving chip 600 may be bonded to the panel 500, for example.

FIGS. 3, 4, 5, 6, and 7 are diagrams illustrating an embodiment of a panel alignment method. In an embodiment, FIGS. 3 to 7 may illustrate an embodiment of a panel alignment method using the panel alignment device 11 in FIGS. 1 and 2, for example.

Figure 3:
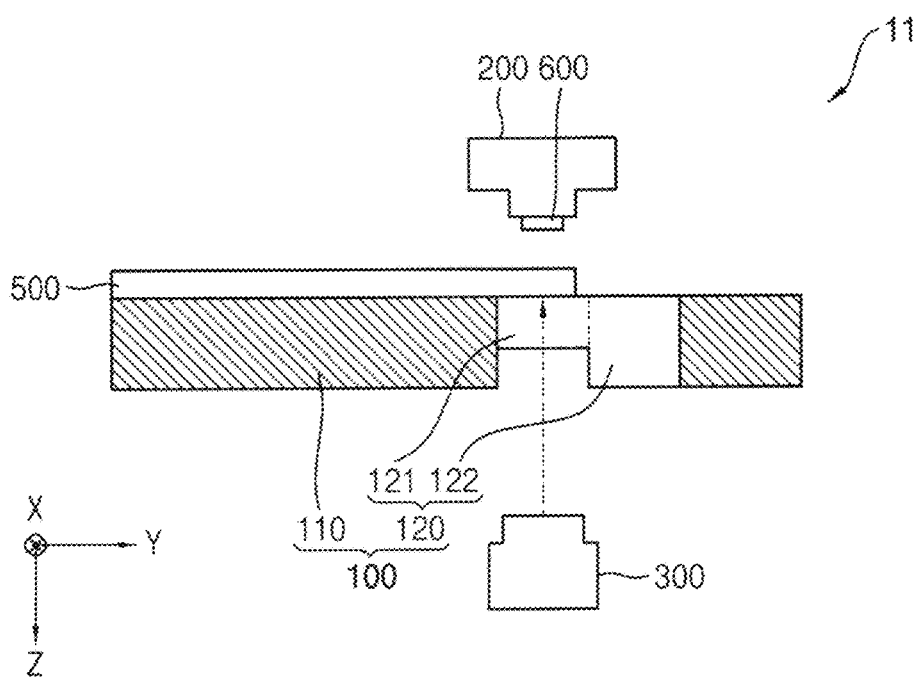
FIGS. 3, 4, 5, 6, and 7 are diagrams illustrating an embodiment of a panel alignment method.

Referring to FIG. 3, the first alignment mark of the panel 500 may be captured through the first region 121 of the transmitting portion 120 of the stage 100. The first image information related to the position of the first alignment mark may be collected from the first image in which the first alignment mark of the panel 500 is captured. The vision camera 300 may overlap the first region 121 of the transmitting portion 120 of the stage 100 when capturing the first alignment mark.

Figure 4:
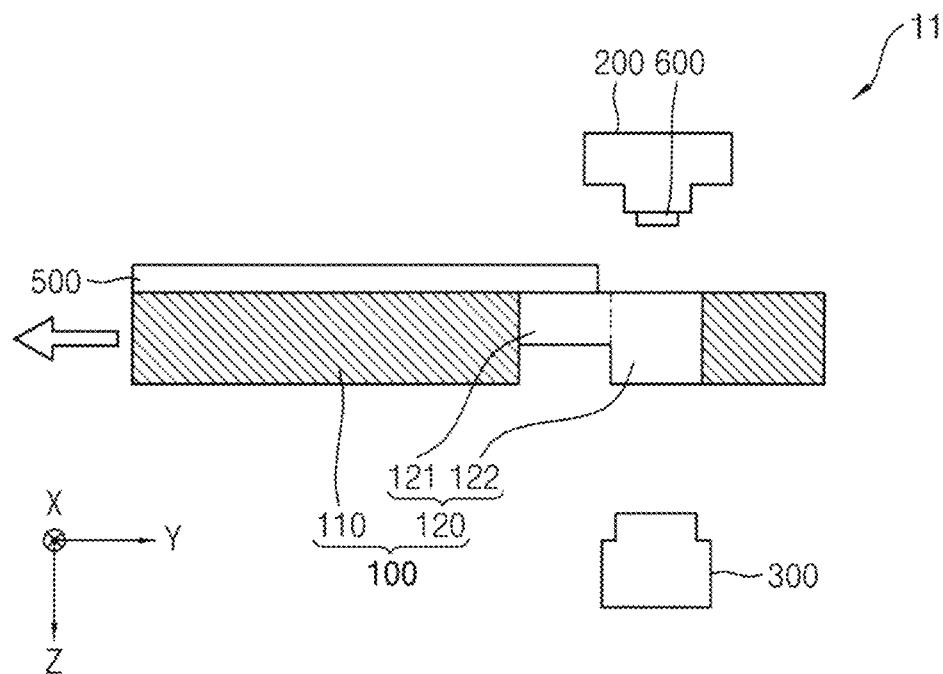

Referring to FIG. 4, the stage 100 may be moved. The stage 100 may be moved such that the vision camera 300 overlaps the second region 122 of the transmitting portion 120 of the stage 100. In an embodiment, the stage 100 may move along the Y-axis direction, for example.

Figure 5:
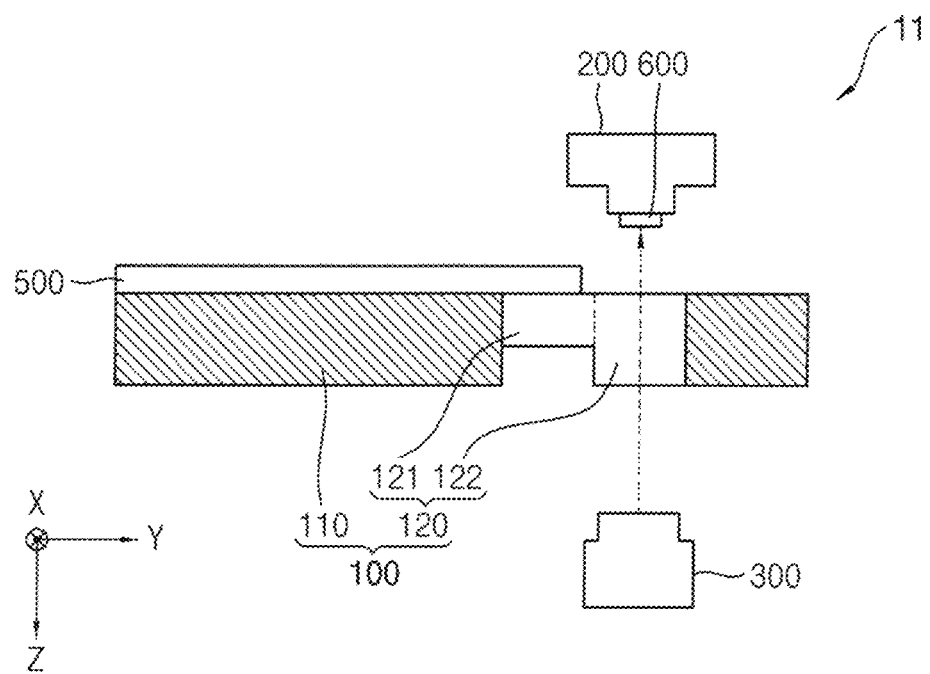

Referring to FIG. 5, the second alignment mark of the driving chip 600 may be captured through the second region 122 of the transmitting portion 120 of the stage 100. The second image information related to the position of the second alignment mark may be collected from the second image in which the second alignment mark of the driving chip 600 is captured.

Figure 6:
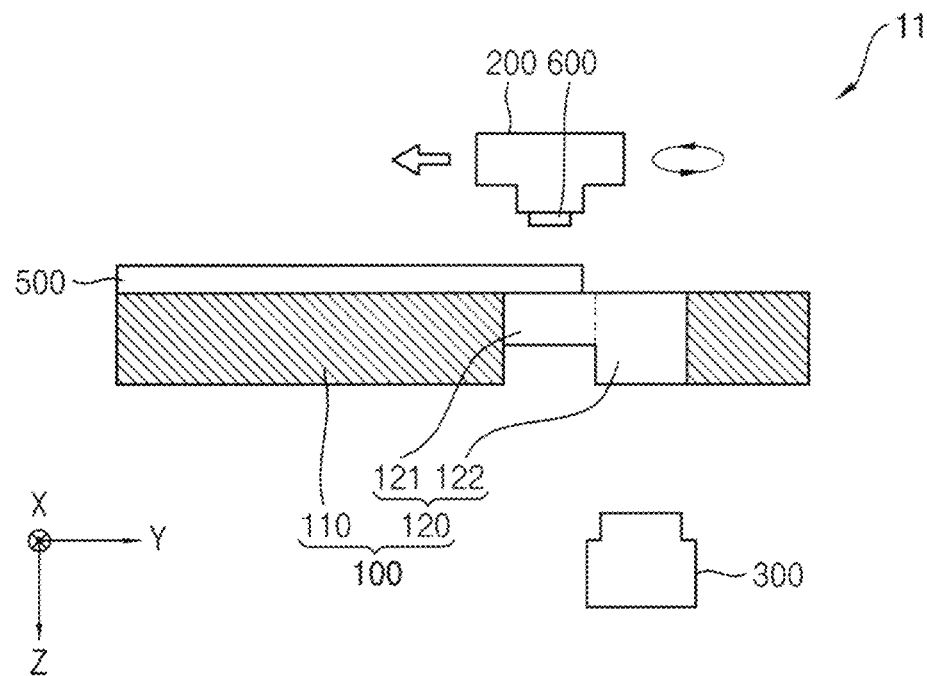

Referring to FIG. 6, the position of the head 200 supporting the driving chip 600 and the position of the stage 100 supporting the panel 500 may be adjusted based on the first image information and the second image information. In an embodiment, the position of the head 200 and the position of the stage 100 may be adjusted such that the first alignment mark of the panel 500 overlaps the second alignment mark of the driving chip 600.

In an embodiment, the head 200 may be moved and rotated to adjust the position of the head 200 and the position of the stage 100. In an embodiment, the head 200 may be moved along the X-axis direction and the Y-axis direction, and may be rotated with the Z-axis direction as a rotation axis to adjust the position of the head 200 and the position of the stage 100, for example.

Figure 7:
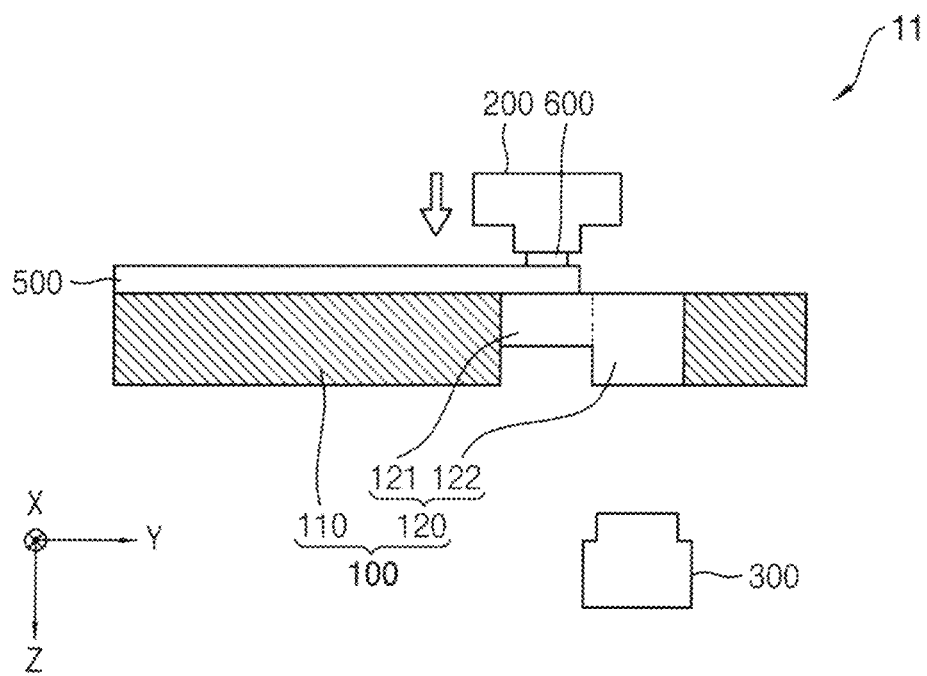

Referring to FIG. 7, the driving chip 600 may be bonded to the panel 500 by moving the head 200. In an embodiment, the driving chip 600 may be bonded to the panel 500 by moving the head 200 along the Z-axis direction. In an embodiment, an anisotropic conductive film may be interposed between the panel 500 and the driving chip 600 during bonding the driving chip 600 to the panel 500, for example.

Figure 8:
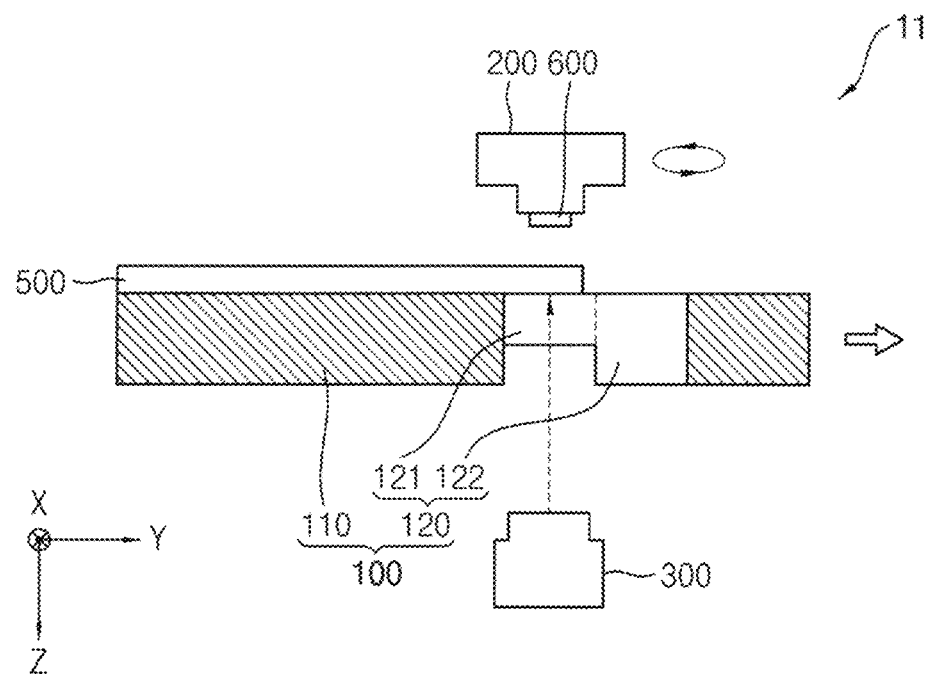
FIG. 8 is a diagram illustrating an embodiment of a panel alignment method.

FIG. 8 is a diagram illustrating an embodiment of a panel alignment method. In an embodiment, FIG. 8 may illustrate another embodiment of the panel alignment method using the panel alignment device 11 in FIGS. 1 and 2, for example.

Another embodiment of the panel alignment method described with reference to FIG. 8 may be substantially the same as or similar to an embodiment of the panel alignment method described with reference to FIGS. 3 to 7 except for the step of adjusting the position of the head 200 and the position of the stage 100. Accordingly, descriptions of the repeated steps will be omitted.

Referring to FIG. 8, in an embodiment, the stage 100 may be moved, and the head 200 may be moved and rotated to adjust the position of the head 200 and the position of the stage 100. In an embodiment, the stage 100 may be moved along the Y-axis direction, and the head 200 may be moved along the X-axis direction and rotated with the Z-axis direction as a rotation axis to adjust the position of the head 200 and the position of the stage 100, for example.

Figure 9A:
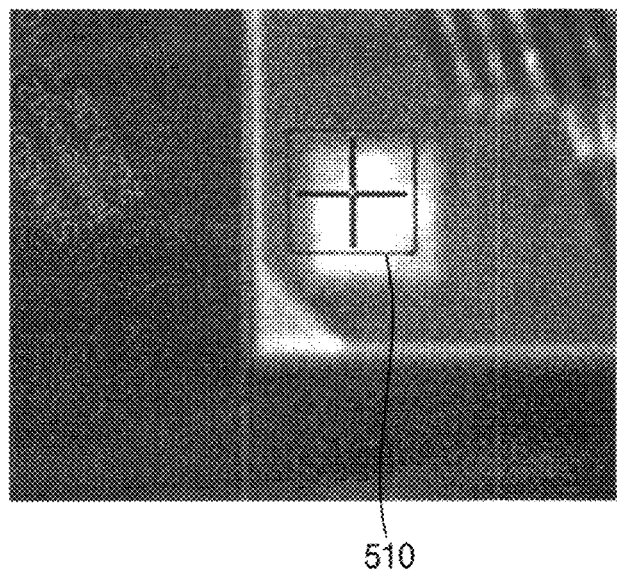
FIGS. 9A and 9B are diagrams illustrating a comparative example of first and second images, respectively.
Figure 9B:
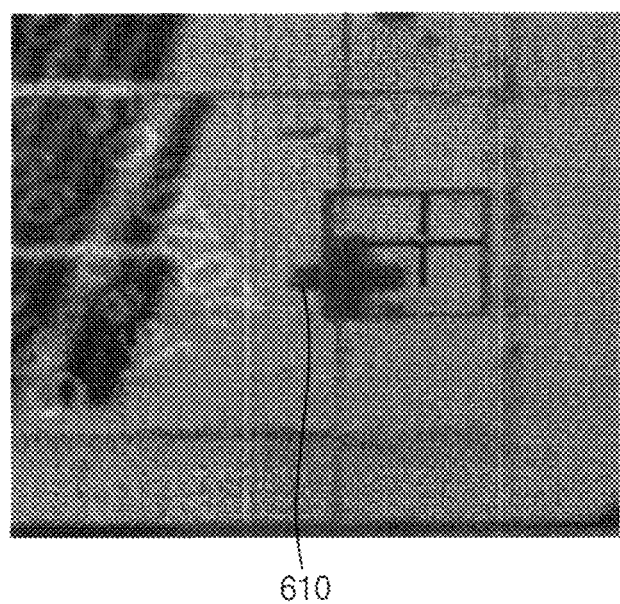

FIGS. 9A and 9B are diagrams illustrating a comparative example the first and second images, respectively. Specifically, FIG. 9A may illustrate the comparative example of the first image, and FIG. 9B may illustrate the comparative example of the second image.

Referring to FIGS. 9A and 9B, a transmitting portion of a stage of a panel alignment device according to the comparative example may have a uniform thickness. In the comparative example, since a first distance from a vision camera to a first alignment mark 510 of a panel is less than a second distance from the vision camera to a second alignment mark 610 of a driving chip, the recognition rate of the first alignment mark 510 and/or the second alignment mark 610 may decrease. Accordingly, the driving chip may not be accurately aligned with the panel.

Further, in the panel alignment method according to the comparative example, the panel may be disposed to overlap the transmitting portion of the stage having the uniform thickness. In the comparative example, as the stage moves such that the stage does not cover the head to capture the second alignment mark of the driving chip, the alignment time between the panel and the driving chip may increase.

Figure 10A:
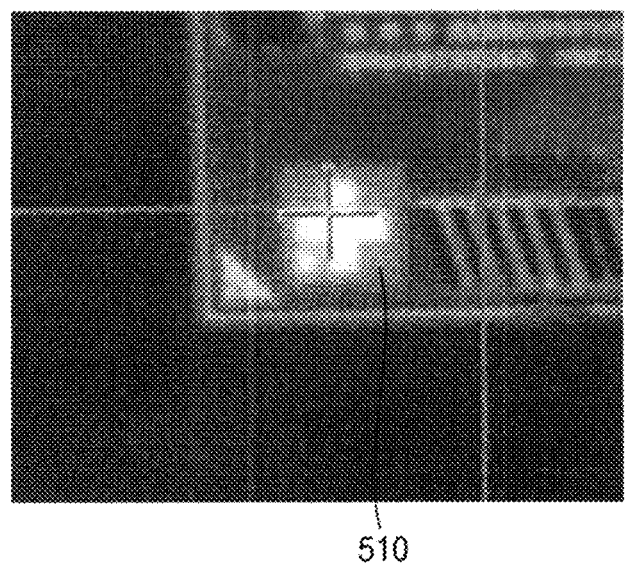
FIGS. 10A and 10B are diagrams illustrating an embodiment of first and second images, respectively.
Figure 10B:
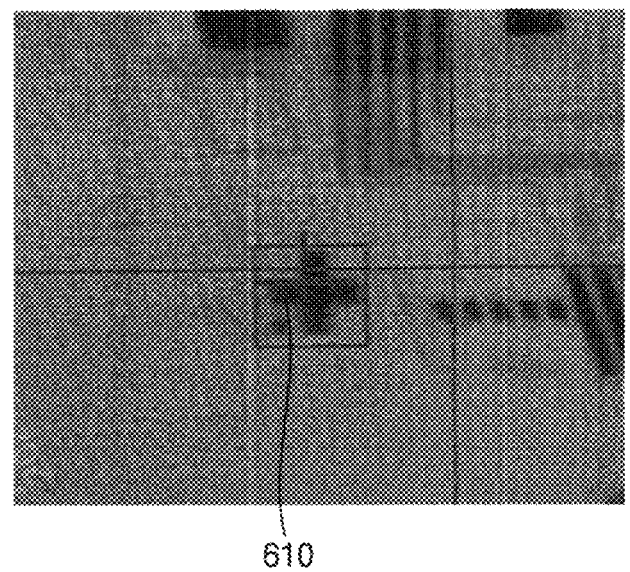

FIGS. 10A and 10B are diagrams illustrating an embodiment of the first and second images respectively. Specifically, FIG. 10A may illustrate an embodiment of the first image, and FIG. 10B may illustrate an embodiment of the second image.

Referring to FIGS. 2, 10A and 10B, the transmitting portion 120 of the stage 100 of the panel alignment device 11 in the embodiment example may include the first region 121 having the first thickness TH1 and the second region 122 having the second thickness TH2 greater than the first thickness TH1. In the embodiment example, although the first distance WD1 from the vision camera 300 to the first alignment mark 510 of the panel 500 is less than the second distance WD2 from the vision camera 300 to the second alignment mark 610 of the driving chip 600, because a difference in the refractive index between the first region 121 and the second region 122 of the transmitting portion 120 due to a difference in the thickness between the first region 121 and the second region 122 compensates the difference between the first distance WD1 and the second distance WD2, the recognition rate of the first alignment mark 510 and the second alignment mark 610 may increase. Accordingly, the driving chip 600 may be accurately aligned with the panel 500.

Further, in the panel alignment method in the embodiment example, as the first alignment mark 510 of the panel 500 is captured through the first region 121 of the transmitting portion 120 of the stage 100 and the second alignment mark 610 of the driving chip 600 is captured through the second region 122 of the transmitting portion 120 of the stage 100, the alignment time between the panel 500 and the driving chip 600 may decrease.

Figure 11:
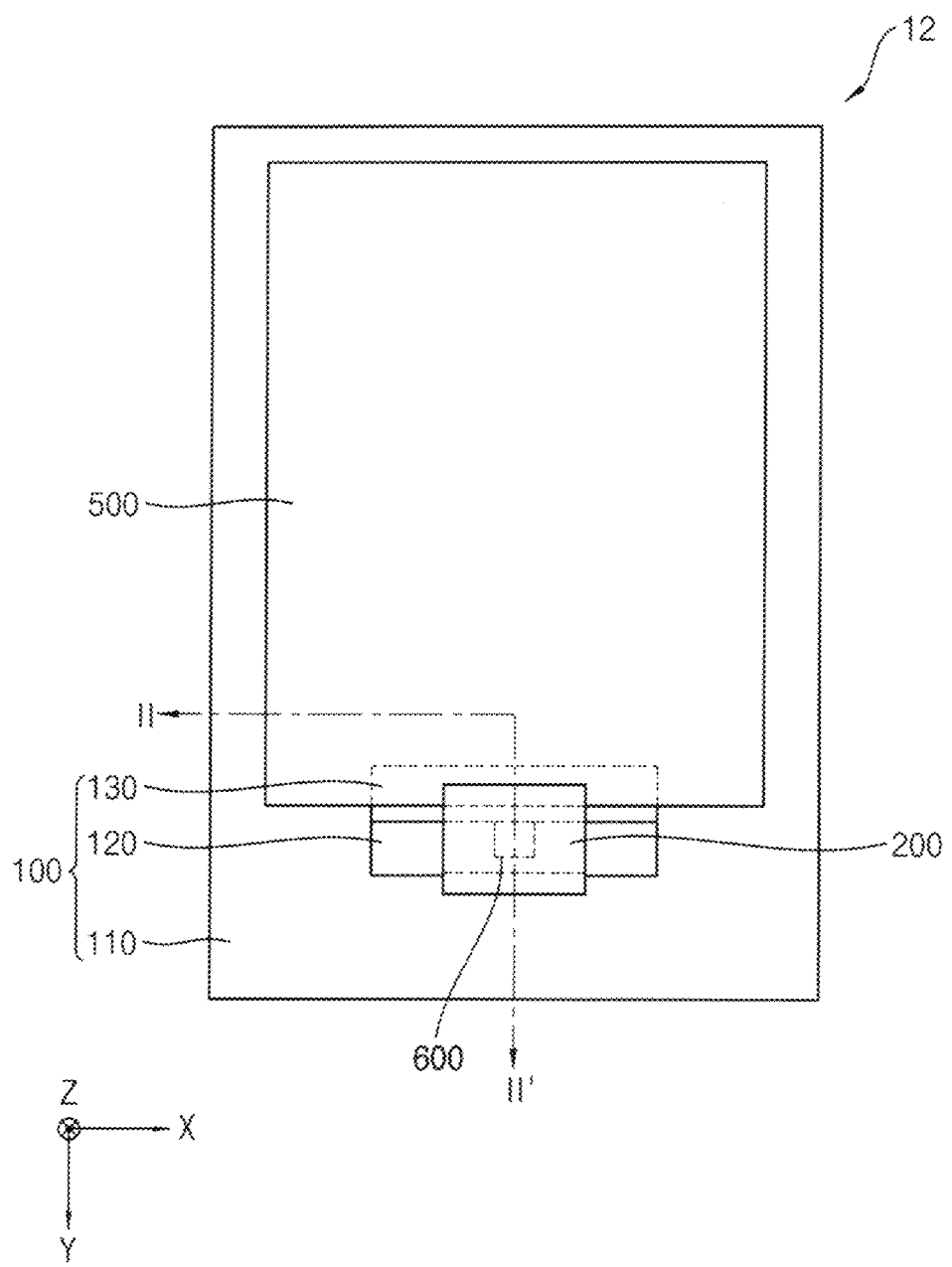
FIG. 11 is a plan view illustrating an embodiment of a panel alignment device.
Figure 12:
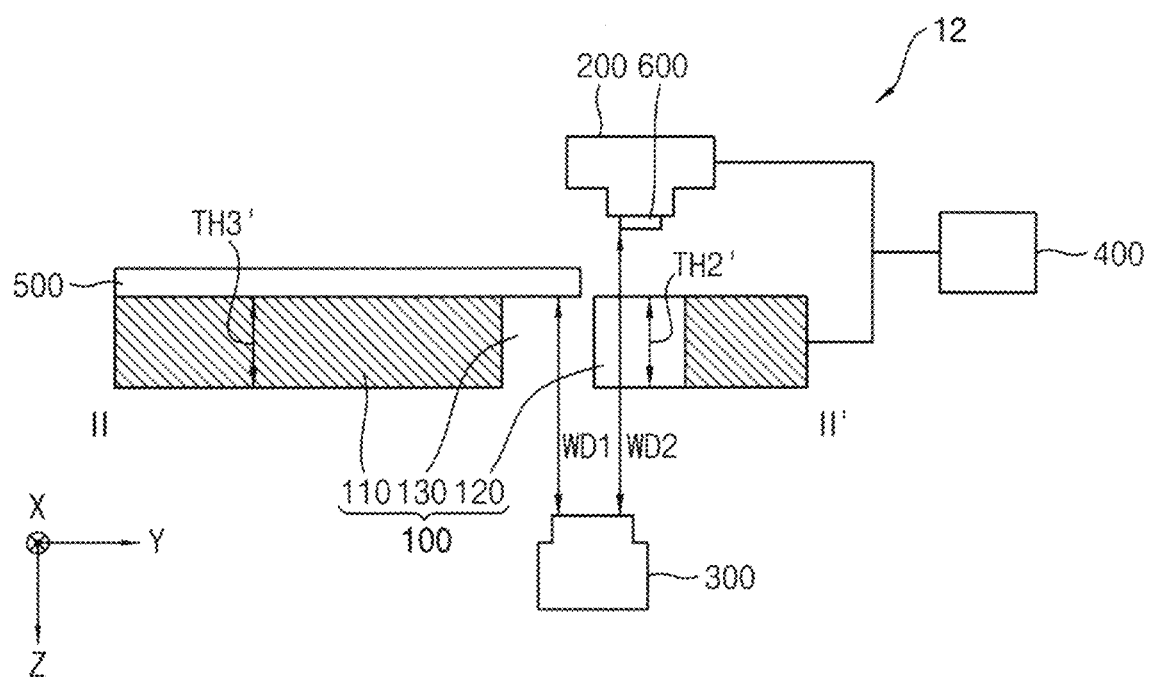
FIG. 12 is a diagram illustrating the panel alignment device taken along line II-IF in FIG. 11.

FIG. 11 is a plan view illustrating an embodiment of a panel alignment device. FIG. 12 is a diagram illustrating the panel alignment device taken along line II-IF in FIG. 11.

Referring to FIGS. 11 and 12, a panel alignment device 12 may include a stage 100, a head 200, a vision camera 300, and a controller 400.

The stage 100 may support a panel 500. The panel 500 may be disposed on an upper surface of the stage 100. A first alignment mark for alignment of the panel 500 and the driving chip 600 may be provided on the panel 500.

The stage 100 may include a non-transmitting portion 110 and a transmitting portion 120, and an opening 130 may be defined in the stage 100. The opening 130 may have a quadrangular (e.g., rectangular) planar shape, the transmitting portion 120 may have a quadrangular (e.g., rectangular) planar shape and be adjacent to the opening 130, and the non-transmitting portion 110 may surround the opening 130 and the transmitting portion 120 in a plan view.

The non-transmitting portion 110 may support the panel 500. The non-transmitting portion 110 may block or absorb light. In other words, the non-transmitting portion 110 may not transmit light.

In an embodiment, the non-transmitting portion 110 may include anodized aluminum. However, the material of the non-transmitting portion 110 is not limited thereto, and the non-transmitting portion 110 may include a material capable of blocking or absorbing light.

The opening 130 may be defined as a portion passing through the stage 100 along the Z-axis direction by removing a part of the stage 100. Accordingly, the opening 130 may transmit light. The panel 500 may overlap the opening 130 and a part of the non-transmitting portion 110 adjacent to the opening 130.

The transmitting portion 120 may transmit light. In an embodiment, the transmitting portion 120 may include quartz. However, the material of the transmitting portion 120 is not limited thereto, and the transmitting portion 120 may include a material capable of transmitting light.

In an embodiment, the transmitting portion 120 may have a uniform thickness. The panel 500 may not overlap the transmitting portion 120.

In an embodiment, a thickness TH2' of the transmitting portion 120 may be substantially equal to a thickness TH3' of the non-transmitting portion 110.

In an embodiment, the stage 100 may be movable. In an embodiment, the stage 100 may move along the X-axis direction and the Y-axis direction, for example. Accordingly, the panel 500 may move according to the movement of the stage 100.

The head 200 may be disposed over the stage 100. The head 200 may support a driving chip 600. The driving chip 600 may be disposed on a lower surface of the head 200. A second alignment mark for alignment of the panel 500 and the driving chip 600 may be provided on the driving chip 600.

In an embodiment, the head 200 may be movable and rotatable. In an embodiment, the head 200 may move along the X-axis direction, the Y-axis direction, and the Z-axis direction, and may rotate with the Z-axis direction as a rotation axis, for example. Accordingly, the driving chip 600 may move and/or rotate according to the movement and/or the rotation of the head 200.

The vision camera 300 may be disposed under the stage 100. The vision camera 300 may capture the first alignment mark of the panel 500 through the opening 130 of the stage 100, and may capture the second alignment mark of the driving chip 600 through the transmitting portion 120 of the stage 100.

In an embodiment, the first alignment mark of the panel 500 may overlap the opening 130 of the stage 100. Accordingly, the vision camera 300 may capture the first alignment mark of the panel 500 through the opening 130 of the stage 100.

In an embodiment, the second alignment mark may overlap the transmitting portion 120 of the stage 100 when capturing the second alignment mark of the driving chip 600. Accordingly, the vision camera 300 may capture the second alignment mark of the driving chip 600 through the transmitting portion 120 of the stage 100.

In an embodiment, a first distance WD1 from the vision camera 300 to the first alignment mark of the panel 500 may be less than a second distance WD2 from the vision camera 300 to the second alignment mark of the driving chip 600. In other words, the second alignment mark of the driving chip 600 may be disposed farther from the vision camera 300 than the first alignment mark of the panel 500 is from the vision camera 300. Since the stage 100 supporting the panel 500 is disposed over the vision camera 300 and the head 200 supporting the driving chip 600 is disposed over the stage 100, the first distance WD1 may be less than the second distance WD2.

The controller 400 may control the movement and/or the rotation of the stage 100 and/or the head 200 based on first image information related to a position of the first alignment mark of the panel 500 and second image information related to a position of the second alignment mark of the driving chip 600. The first image information may be collected from a first image in which the first alignment mark of the panel 500 is captured, and the second image information may be collected from a second image in which the second alignment mark of the driving chip 600 is captured.

In an embodiment, the controller 400 may move and/or rotate the stage 100 and/or the head 200 such that the first alignment mark of the panel 500 overlaps the second alignment mark of the driving chip 600. Accordingly, the stage 100 and/or the head 200 may be moved and/or rotated so that the panel 500 and the driving chip 600 may be aligned.

In an embodiment, the controller 400 may move and rotate the head 200 such that the first alignment mark of the panel 500 may overlap the second alignment mark of the driving chip 600. In an embodiment, the controller 400 may move the head 200 along the X-axis direction and the Y-axis direction, and may rotate the head 200 with the Z-axis direction as a rotation axis, for example.

In another embodiment, the controller 400 may move the stage 100 and may move and rotate the head 200 such that the first alignment mark of the panel 500 overlaps the second alignment mark of the driving chip 600. In an embodiment, the controller 400 may move the stage 100 along the Y-axis direction, may move the head 200 along the X-axis direction, and may rotate the head 200 with the Z-axis direction as a rotation axis, for example.

In an embodiment, the controller 400 may move the head 200 such that the driving chip 600 is bonded to the panel 500 in a state in which the first alignment mark of the panel 500 overlaps the second alignment mark of the driving chip 600. In an embodiment, the controller 400 may move the head 200 along the Z-axis direction so that the driving chip 600 may be bonded to the panel 500, for example.

The stage 100 of the panel alignment device 12 in the illustrated embodiment may include the transmitting portion 120 and the opening 130 may be defined in the stage 100 such that the transmitting portion 120 is adjacent to the opening 130. In this case, although the first distance WD1 from the vision camera 300 to the first alignment mark of the panel 500 is less than the second distance WD2 from the vision camera 300 to the second alignment mark of the driving chip 600, because a difference in the refractive index between the opening 130 and the transmitting portion 120 compensates the difference between the first distance WD1 and the second distance WD2, the recognition rate of the first alignment mark and the second alignment mark may increase. Accordingly, the driving chip 600 may be accurately aligned with the panel 500.

The panel alignment device and the panel alignment method for the display device in the embodiments may be applied to a method of manufacturing a display device included in a computer, a notebook, a mobile phone, a smartphone, a smart pad, a portable media player ("PMP"), a personal digital assistant ("PDA"), an MP3 player, or the like.

Although the panel alignment devices and the panel alignment methods for the display devices in the embodiments have been described with reference to the drawings, the illustrated embodiments are examples, and may be modified and changed by a person having ordinary knowledge in the relevant technical field without departing from the technical spirit of the invention.

What is claimed is:

1. A panel alignment device for a display device, the panel alignment device comprising:
   a stage which supports a panel and includes a transmitting portion which is adjacent to an opening defined in the stage;
   a head disposed over the stage and supporting a driving chip;
   a vision camera which is disposed under the stage, captures a first alignment mark of the panel through the opening, and captures a second alignment mark of the driving chip through the transmitting portion; and
   a controller which controls at least one of a movement and a rotation of each of the stage and the head based on a first image information related to a position of the first alignment mark and a second image information related to a position of the second alignment mark.

2. The panel alignment device of claim 1, wherein the first alignment mark overlaps the opening.

3. The panel alignment device of claim 1, wherein the second alignment mark overlaps the transmitting portion when capturing the second alignment mark.

4. The panel alignment device of claim 1, wherein a thickness of the transmitting portion is uniform.

5. The panel alignment device of claim 1, wherein the stage further includes a non-transmitting portion surrounding the opening and the transmitting portion, and supporting the panel, and
   wherein a thickness of the transmitting portion is equal to a thickness of the non-transmitting portion.

* * * * *